US008804455B2

(12) United States Patent
Lee et al.

(10) Patent No.: US 8,804,455 B2
(45) Date of Patent: Aug. 12, 2014

(54) SEMICONDUCTOR DEVICE CAPABLE OF ADJUSTING MEMORY PAGE SIZE BASED ON A ROW ADDRESS, A BANK ADDRESS AND A POWER SUPPLY VOLTAGE

(71) Applicant: Samsung Electronics Co., Ltd., Suwon-si (KR)

(72) Inventors: Hoon Lee, Hwasung-si (KR); Uk Song Kang, Hwasung-si (KR); Hoe Ju Chung, Hwasung-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/828,604

(22) Filed: Mar. 14, 2013

(65) Prior Publication Data
US 2013/0201778 A1 Aug. 8, 2013

Related U.S. Application Data

(62) Division of application No. 12/684,497, filed on Jan. 8, 2010, now Pat. No. 8,411,528.

(30) Foreign Application Priority Data

Jan. 13, 2009 (KR) ........................ 10-2009-0002495

(51) Int. Cl.
*G11C 8/12* (2006.01)

(52) U.S. Cl.
USPC .............. 365/230.06; 365/230.03; 365/225.7; 365/189.05; 365/51; 365/63

(58) Field of Classification Search
USPC ......... 365/230.04, 230.03, 230.06, 225.7, 51, 365/63, 189.08, 189.05
See application file for complete search history.

(56) References Cited

U.S. PATENT DOCUMENTS

| | | | |
|---|---|---|---|
| 8,411,528 B2 * | 4/2013 | Lee et al. | 365/230.06 |
| 2006/0181935 A1 * | 8/2006 | Choi | 365/189.01 |
| 2006/0181940 A1 | 8/2006 | Lim | |

FOREIGN PATENT DOCUMENTS

| | | |
|---|---|---|
| CN | 1438579 | 8/2003 |
| CN | 1758438 | 4/2006 |
| CN | 101582295 | 11/2009 |

* cited by examiner

*Primary Examiner* — Andrew Q Tran
(74) *Attorney, Agent, or Firm* — F. Chau & Associates, LLC

(57) ABSTRACT

A semiconductor device includes a memory cell array comprising a plurality of banks and a page size controller. The page size controller decodes a part of a bank selection address or a power supply voltage and a remaining part of the bank selection address to enable one of the plurality of banks or enable two of the plurality of banks to set a page size of the semiconductor device.

20 Claims, 15 Drawing Sheets

FIG. 3
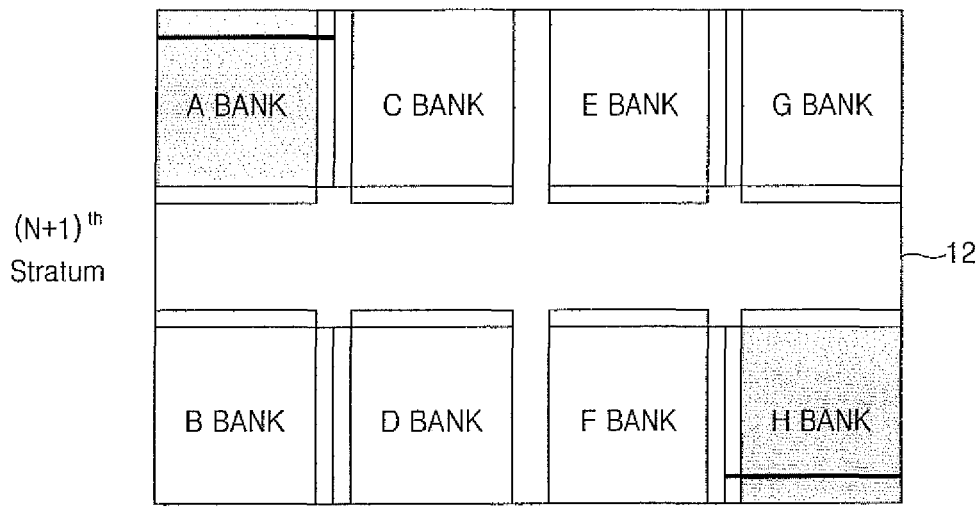
(N+1)$^{th}$ Stratum
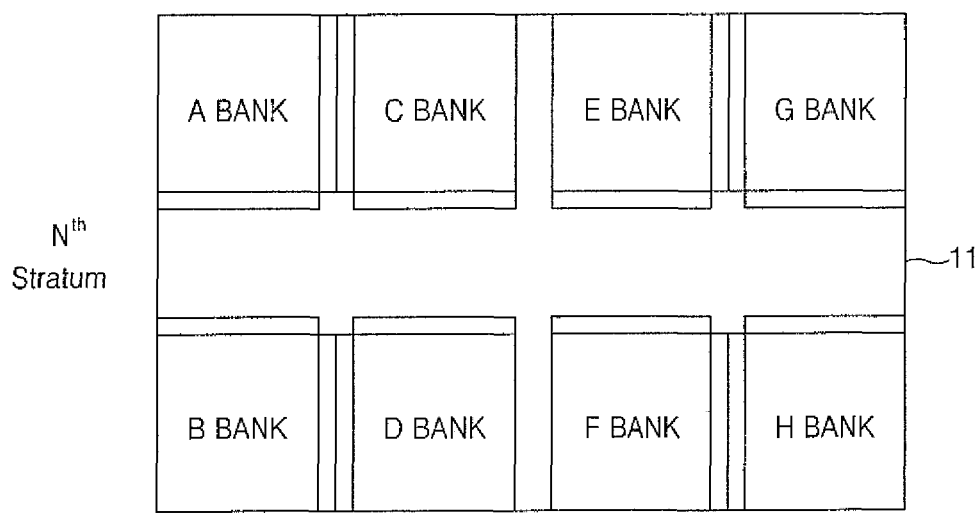
N$^{th}$ Stratum
- 2 W/L enabled in one stratum
- Chip ID : A14, A15, B2

FIG. 4
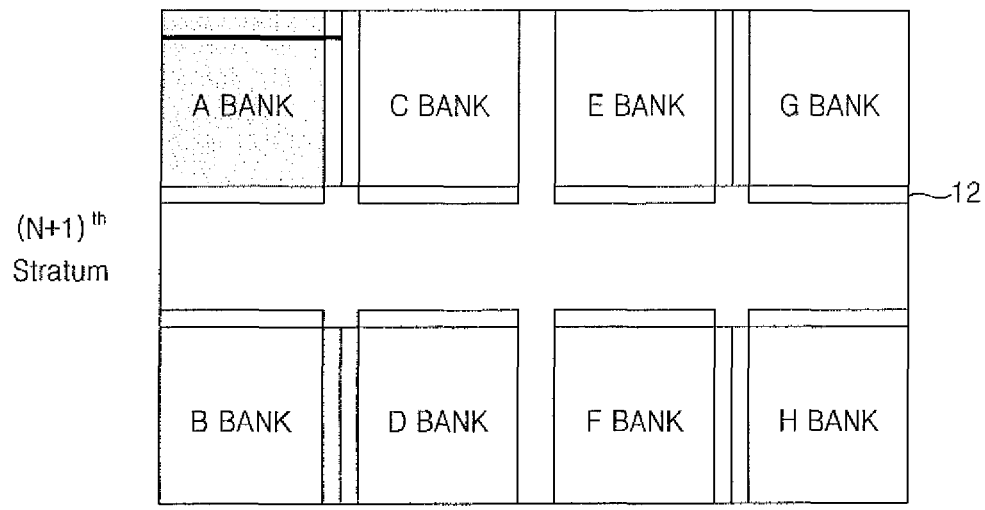
(N+1)th Stratum
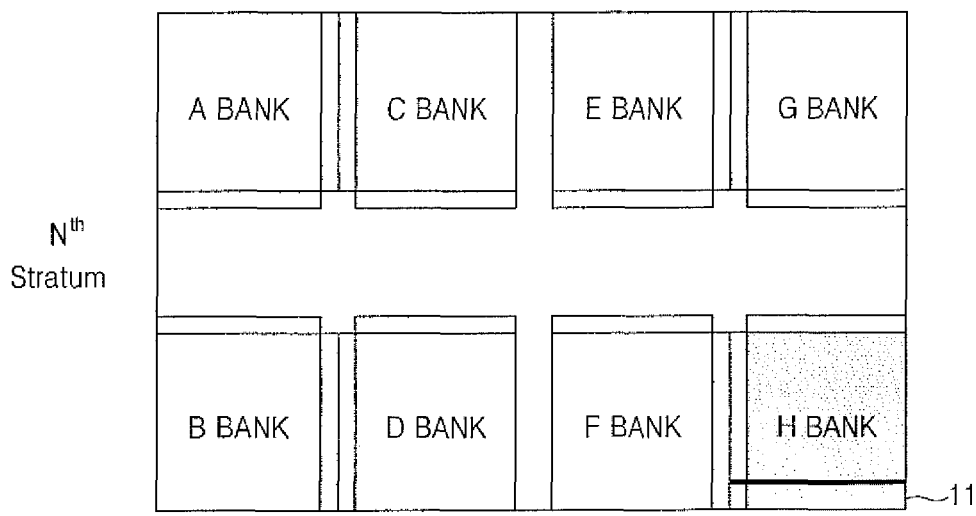
Nth Stratum
-- 2 W/L enabled in two strata
- Chip ID : A14, A15

FIG. 6

| Density | 1Gb | 2Gb | 4Gb | 8Gb |
|---|---|---|---|---|
| IO Width | X8 | | | |
| Bank Adr/Stack | BA0 ~ BA2 | BA0 ~ BA2 | BA0 ~ BA2 | BA0 ~ BA1 |
| Row Adr/Stack | A0~A13 | A0~A13 | A0~A13 | A0~A13 |
| Column Adr/Stack | A0~A9 | A0~A9 | A0~A9 | A0~A9,A11 |
| Chip ID | – | A14 | A14,A15 | A14,A15 BA2 |
| Page Size | 1KB | 1KB | 1KB | 2KB |

FIG. 8

| Page Size | Fuse | Operation |
|---|---|---|
| 1KB | Cut | $\overline{BA<0>}\overline{BA<1>}\overline{BA<2>}$ = A Bank |
| | | $\overline{BA<0>}BA<1>\overline{BA<2>}$ = H Bank |
| | | $\overline{BA<0>}\overline{BA<1>}BA<2>$ = B Bank |
| | | $\overline{BA<0>}BA<1>BA<2>$ = G Bank |
| | | $BA<0>\overline{BA<1>}BA<2>$ = C Bank |
| | | $BA<0>\overline{BA<1>}\overline{BA<2>}$ = F Bank |
| | | $BA<0>BA<1>BA<2>$ = D Bank |
| | | $BA<0>BA<1>\overline{BA<2>}$ = E Bank |
| 2KB | Not cut | $\overline{BA<0>}\overline{BA<1>}$ = A,H Bank |
| | | $\overline{BA<0>}BA<1>$ = B,G Bank |
| | | $BA<0>\overline{BA<1>}$ = C,F Bank |
| | | $BA<0>BA<1>$ = D,E Bank |

FIG. 10

|  | 1Gb density | 2Gb density | 4Gb density | 8Gb density |
|---|---|---|---|---|
| Fuse for BA<2> | Not cut | Not cut | Not cut | cut |
| Fuse for RA<15> | Not cut | Not cut | cut | cut |
| Fuse for RA<14> | Not cut | cut | cut | cut |
| Fuse for CA<11> | Not cut | Not cut | Not cut | cut |

FIG. 12

| Density | 1Gb | 2Gb | 4Gb | 8Gb |
|---|---|---|---|---|
| IO Width | X8 | | | |
| Bank Adr/Stack | BA0 ~ BA2 | BA0 ~ BA2 | BA0 ~ BA2 | BA0 ~ BA2 |
| Row Adr/Stack | A0~A13 | A0~A13 | A0~A13 | A0~A13 |
| Column Adr/Stack | A0~A9 | A0~A9 | A0~A9 | A0~A9,A11 |
| Chip ID | – | A14 | A14,A15 | A14,A15 |
| Page Size | 1KB | 1KB | 1KB | 2KB |

FIG. 14

|  | 1Gb density | 2Gb density | 4Gb density | 8Gb density |
|---|---|---|---|---|
| Fuse for RA<15> | Not cut | Not cut | cut | cut |
| Fuse for RA<14> | Not cut | cut | cut | cut |
| Fuse for CA<11> | Not cut | Not cut | Not cut | cut |

111# SEMICONDUCTOR DEVICE CAPABLE OF ADJUSTING MEMORY PAGE SIZE BASED ON A ROW ADDRESS, A BANK ADDRESS AND A POWER SUPPLY VOLTAGE

CROSS-REFERENCE TO RELATED APPLICATIONS

This application is a divisional application of co-pending U.S. application Ser. No. 12/684,497 filed Jan. 8, 2010, which claims priority to Korean Patent Application No. 10-2009-0002495, filed on Jan. 13, 2009, in the Korean Intellectual Property Office (KIPO), the disclosures of which are each incorporated by reference herein in their entireties.

BACKGROUND

1. Technical Field

Embodiments of the present inventive concept relate to a semiconductor device, and more particularly, to a semiconductor device capable of adjusting a page size, a multi-chip package including the semiconductor device, and a semiconductor system including the multi-chip package.

2. Discussion of Related Art

Semiconductor memory is a semiconductor device, which may be used as computer memory. Examples of semiconductor memory include non-volatile memory such as Read-only memory (ROM), magnetoresistive random access memory (MRAM), flash memory, etc.

Semiconductor memory may be divided into pages of a fixed size (e.g., 1K byte pages, 2 k byte pages, etc). Data from each page can be accessed by using a binary address. For example, a 1K page has $2^{10}$ bytes, and thus data of the 1K page could be accessed using a 10 bit address. However, it may not be efficient to use a fixed page size. For example, if data is extracted from the memory in units of pages, the entire page needs to be accessed even though only a small portion of each page currently has data.

Thus, there is a need for a semiconductor device that is capable of adjusting a page size, a multi-chip package including the semiconductor device, and a semiconductor system including the multi-chip package.

SUMMARY

A semiconductor device according to an exemplary embodiment of the inventive concept includes a memory cell array having a plurality of banks and a page size controller configured to decode a part of a bank selection address or a power supply voltage and a remaining part of the bank selection address to enable one of the plurality of banks or enable at two of the plurality of banks to set a page size of the semiconductor device.

A semiconductor device according to an exemplary embodiment of the inventive concept includes a memory cell array having a plurality of banks and a page size controller configured to use a part of a row address as a chip ID and enable one bank among the plurality of banks based on a bank selection address in a first mode and to use a combination of a part of the bank selection address and the part of the row address as the chip ID and enable at least two banks among the plurality of banks based on a remaining part of the bank selection address in a second operation mode.

A semiconductor device according to an exemplary embodiment of the inventive concept includes a plurality of stacked semiconductor chips each including a plurality of banks. The plurality of semiconductor chips respectively include page size controllers configured to select one semiconductor chip among the plurality of semiconductor chips based on a chip selection address including a part of a bank selection address and a part of a row address and to enable at least two banks among the plurality of banks included in the selected semiconductor chip based on a remaining part of the bank selection address to increase a page size.

A semiconductor device according to an exemplary embodiment of the inventive concept includes a plurality of stacked semiconductor chips each including a plurality of banks. The plurality of semiconductor chips respectively include page size controllers configured to select at least two semiconductor chips among the plurality of semiconductor chips based on a part of a row address and to enable one bank among the plurality of banks included in each of the selected semiconductor chips based on a bank selection address.

BRIEF DESCRIPTION OF THE DRAWINGS

Embodiments of the inventive concept will become more apparent by describing in detail exemplary embodiments thereof with reference to the attached drawings in which:

FIG. 3 illustrates a scheme of changing a page size of a semiconductor device based on the number of stacked semiconductor chips according to an exemplary embodiment of the inventive concept;

FIG. 4 illustrates a scheme of changing a page size of a semiconductor device based on the number of stacked semiconductor chips according to an exemplary embodiment of the inventive concept;

FIG. 6 shows an example of address allocation in the semiconductor chip illustrated in FIG. 5;

FIG. 8 shows exemplary fuse options of a selection signal generation circuit for controlling the operation of each bank illustrated in FIG. 3;

FIG. 10 shows exemplary fuse options of a fuse box illustrated in FIG. 5;

FIG. 12 shows an example of address allocation in the semiconductor chip illustrated in FIG. 11;

FIG. 14 shows exemplary fuse options of a fuse box illustrated in FIG. 13; and

DETAILED DESCRIPTION OF EXEMPLARY EMBODIMENTS

Figure 1:
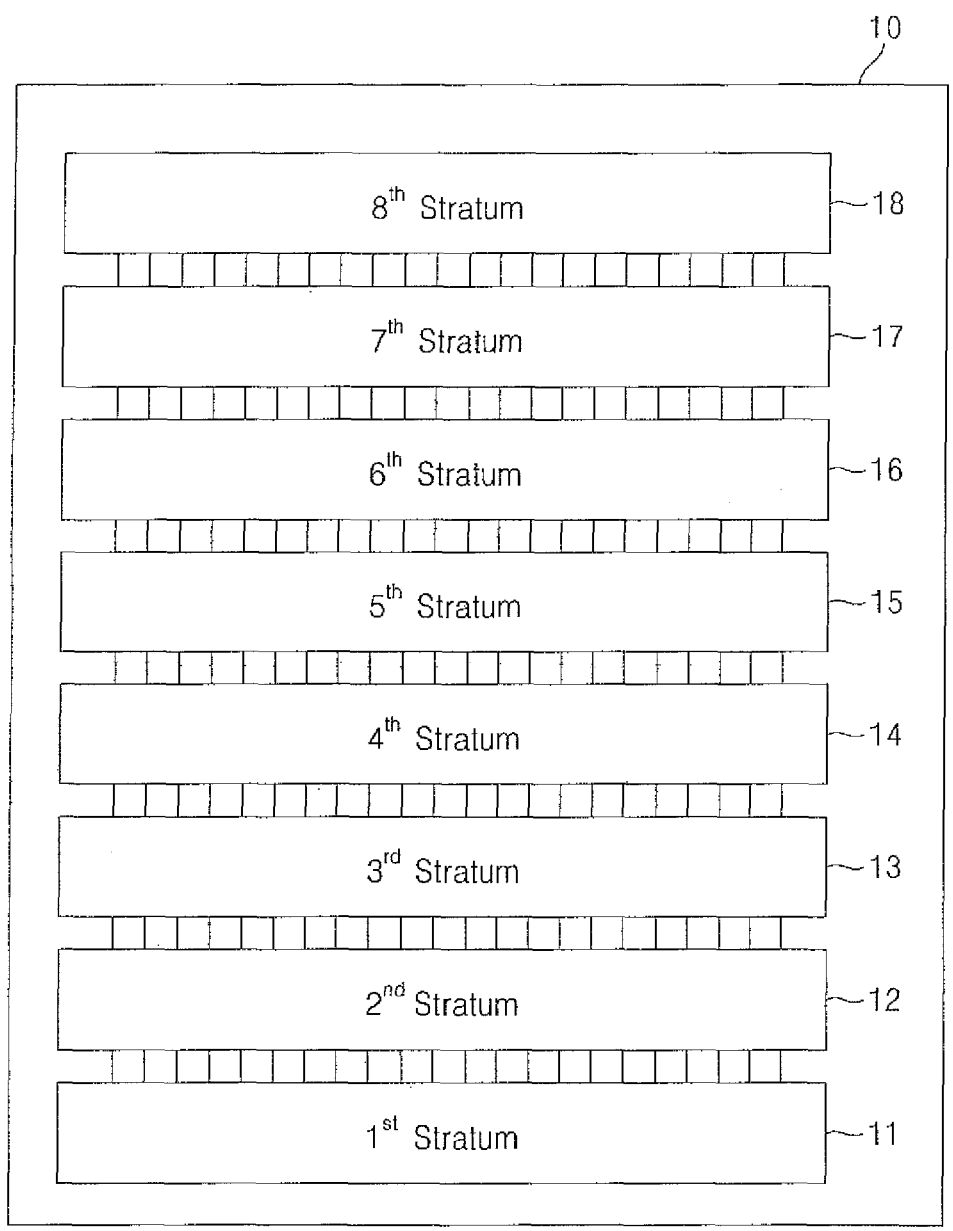
FIG. 1 is a schematic block diagram of a semiconductor device in which eight semiconductor chips are stacked according to an exemplary embodiment of the inventive concept.

Exemplary embodiments of the inventive concept will now be described more fully hereinafter with reference to the accompanying drawings. Inventions based on the inventive concept may, however, be embodied in many different forms and should not be construed as limited to the exemplary embodiments set forth herein. In the drawings, the size and relative sizes of layers and regions may be exaggerated for clarity, and like numbers refer to like elements throughout. It will be understood that when an element is referred to as being "connected" or "coupled" to another element, it can be directly connected or coupled to the other element or intervening elements may be present.

Figure 2:
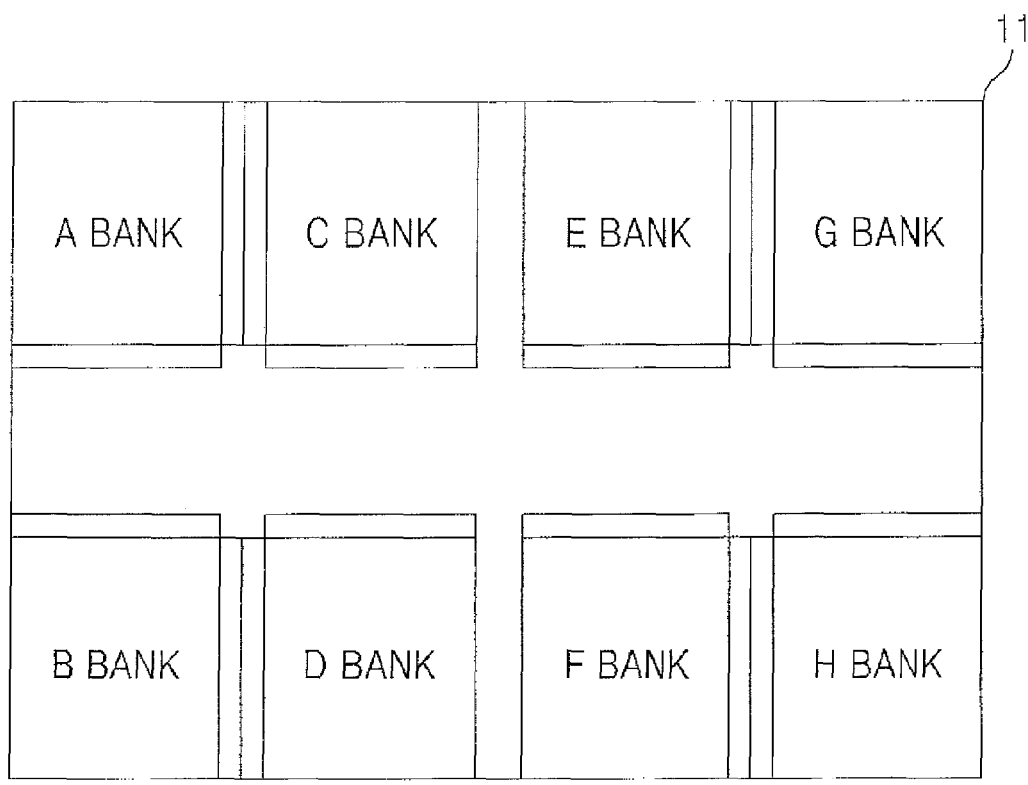
FIG. 2 is a diagram showing banks included in each of the eight semiconductor chips illustrated in FIG. 1.

FIG. 1 is a schematic block diagram of a semiconductor device 10 in which eight semiconductor chips 11, 12, ..., and 18 are stacked according to an exemplary embodiment of the inventive concept. FIG. 2 is a diagram showing banks included in each of the eight semiconductor chips 11 through 18 illustrated in FIG. 1. Illustration in FIG. 1 of the semiconductor device 10 including eight semiconductor chips 11 through 18 and in FIG. 2 of semiconductor chip 11 including eight banks is provided merely for ease of discussion, as embodiments of the inventive concept are not limited to any particular number of stacked semiconductor chips or to any particular number of banks.

The semiconductor device 10 may be implemented in a multi-chip package. In addition, the semiconductor device 10 may be packed using package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), wafer-level processed stack package (WSP), etc.

Referring to FIG. 1, the semiconductor device 10 includes N (which is a positive integer, e.g., 8) stacked semiconductor chips 11 through 18. Each of the semiconductor chips 11 through 18 includes M (which is a positive integer, e.g., 8) banks, i.e., A through H banks.

For ease of discussion, it is assumed that each of the semiconductor chips 11 through 18 is a 1-gigabyte (GB) double data rate 3 (DDR3) chip and each of the A through H banks has a page size of L (which is a positive integer, e.g., 1) kilobyte (KB). However, embodiments of the inventive concept are not limited to DDR3 memory or memories of a 1 GB size.

The page size of the semiconductor device 10 may be L KB or aL KB according to the number of stacked semiconductor chips, where "a" is a positive integer (e.g., 2). The page size of a semiconductor device with two stacked semiconductor chips may be set to 1 KB by a programmable page size controller (see e.g., 30 in FIG. 5). The page size of a semiconductor device with four stacked semiconductor chips may be set to 1 KB. The page size of a semiconductor device with eight stacked semiconductor chips may be set to 2 KB. A method of realizing a 2-KB page will be described in detail with reference to FIGS. 3 and 4.

FIG. 3 illustrates a scheme of changing a page size of a semiconductor device according to the number of stacked semiconductor chips according to an exemplary embodiment of the inventive concept. Referring to FIGS. 1 through 3, in the scheme illustrated in FIG. 3, two wordlines are enabled to simultaneously select two banks (e.g., A bank and H bank) among eight banks, i.e., A through H banks implemented in one stratum (e.g., the first semiconductor chip 11 or the second semiconductor chip 12), thereby realizing a 2 KB page size. Referring to FIG. 6, a part (e.g., RA14 and RA15) of a row address RA<15:0> and a part (e.g., BA2) of a bank selection address BA<2:0> may be used to select one of the eight semiconductor chips 11 through 18. Further, the remaining part (e.g., BA0 and BA1) of the bank selection address BA<2:0> may be used to select two banks from among the eight A through H banks.

FIG. 4 illustrates a scheme of changing a page size of a semiconductor device according to the number of stacked semiconductor chips according to an exemplary embodiment of the inventive concept. Referring to FIGS. 1, 2, and 4, in the scheme illustrated in FIG. 4, each wordline implemented in two semiconductor chips (e.g., 11 and 12) among the eight semiconductor chips 11 through 18 is enabled, thereby realizing the 2 KB page size. Referring to FIG. 12, the part (e.g., RA14 and RA15) of the row address RA<15:0> may be used to select two chips from among the eight semiconductor chips 11 through 18. Further, the bank selection address BA<2:0> may be used to select one of the A through H banks implemented in each of the semiconductor chips 11 through 18.

Figure 5:
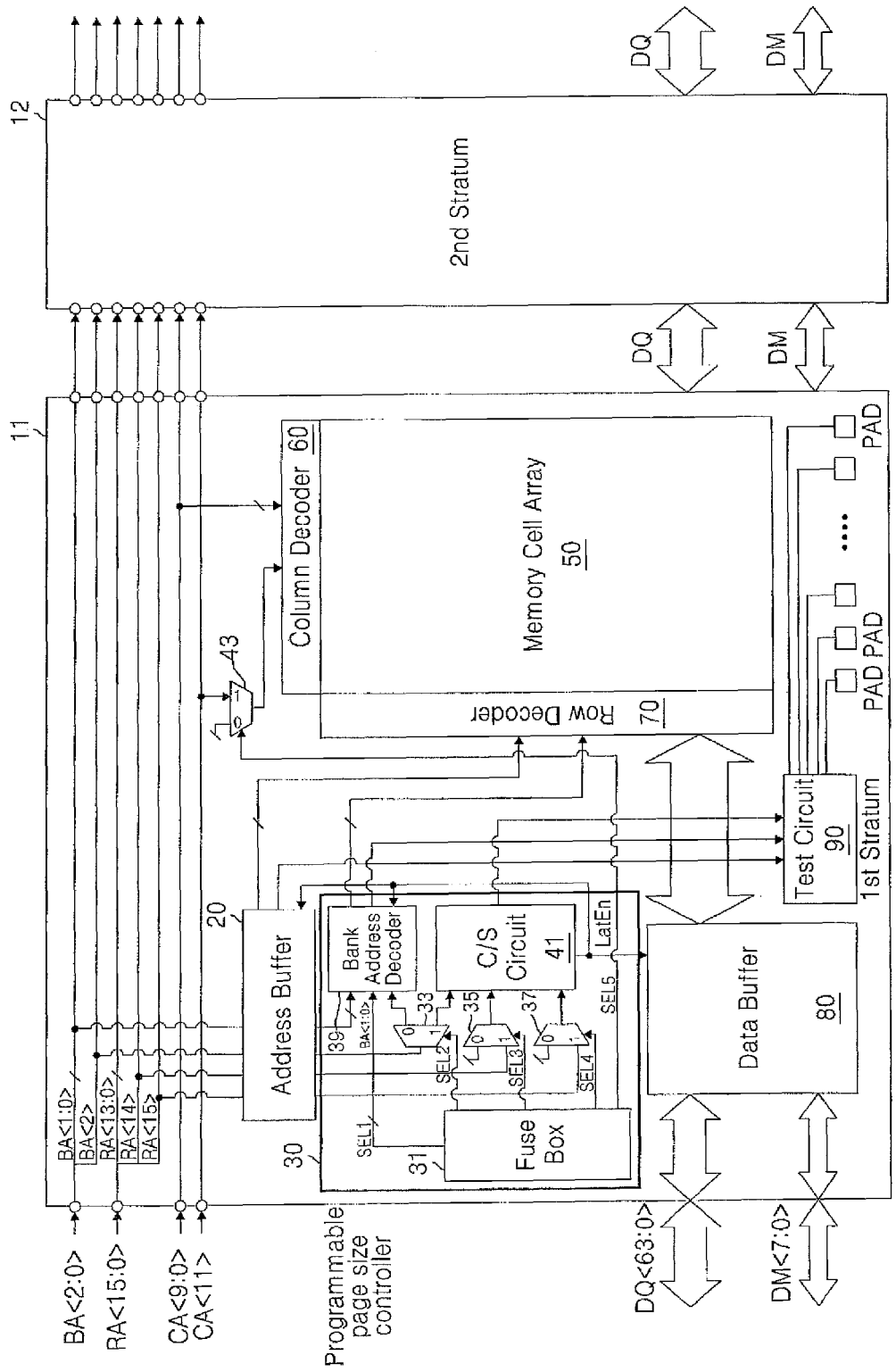
FIG. 5 is a diagram of an internal structure of a semiconductor chip for realizing the scheme illustrated in FIG. 3 according to an exemplary embodiment of the inventive concept.

FIG. 5 is a diagram of an internal structure of a semiconductor chip for realizing the scheme illustrated in FIG. 3 according to an exemplary embodiment of the inventive concept. The semiconductor chips 11 through 18 illustrated in FIG. 1 have the same structure. Thus, the internal structure of the first semiconductor chip 11 will only be described for ease of discussion. Referring to FIG. 5, the first semiconductor chip 11 includes an address buffer 20, a programmable page size controller 30, a memory cell array 50, a column decoder 60, a row decoder 70, and a data buffer 80.

The address buffer 20 receives and buffers the bank selection address BA<2:0> and the row address RA<15:0> in response to an activated enable signal LatEn output from a chip selection circuit 41 and outputs a buffered row address to the row decoder 70.

The bank selection address BA<2:0>, the row address RA<15:0>, and first and second column addresses CA<9:0> and CA<11> are input to each of the semiconductor chips 11 through 18. The programmable page size controller 30 includes a selection signal generation circuit 31, a plurality of selection circuits 33, 35, and 37, a bank address decoder 39, and the chip selection circuit 41.

The selection signal generation circuit 31 may be implemented by a fuse box including a plurality of fuse units. The fuse box 31 outputs a plurality of first selection signals SEL1 to the bank address decoder 39. The fuse box 31 also outputs second, third, and fourth selection signals SEL2, SEL3, and SEL4 to the first, second, and third selection circuits 33, 35, and 37, respectively, and outputs a fifth selection signal SEL5 to a fourth selection circuit 43. Each of the fuse units may be implemented by a fuse circuit or an anti-fuse circuit. Alternatively, the selection signal generation circuit 31 generating the selection signals SEL1 through SEL5 may be implemented by a mode register set (MRS).

The first selection circuit 33 may be implemented by a demultiplexer and outputs a part (e.g., the most significant bit (MSB), i.e., BA<2>) of the bank selection address BA<2:0> to the bank address decoder 39 or the chip selection circuit 41 in response to the second selection signal SEL2 output from the fuse box 31. For example, when the semiconductor device 10 illustrated in FIG. 1 is used as a semiconductor device having a page size of 1 KB, the first selection circuit 33 outputs the MSB (e.g., BA<2>) of the bank selection address BA<2:0> to the bank address decoder 39 in response to the second selection signal SEL2 at a first level (e.g., a low level). When the semiconductor device 10 illustrated in FIG. 1 is used as a semiconductor device having a page size of 2 KB, the first selection circuit 33 outputs the MSB (e.g., BA<2>) of the bank selection address BA<2:0> to the chip selection circuit 41 in response to the second selection signal SEL2 at a second level (e.g., a high level). The second selection signal SEL2 may be generated based on cutting of fuses of the fuse box 31.

The second selection circuit 35 may be implemented by a multiplexer and outputs a power supply voltage VDD at the second level or a first part (e.g., RA<14>) of the row address RA<15:0> to the chip selection circuit 41 in response to the third selection signal SEL3 output from the fuse box 31. For example, when the semiconductor device 10 illustrated in FIG. 1 is used as a semiconductor device having a page size of 2 KB, the second selection circuit 35 outputs the first part (e.g., RA<14>) of the row address RA<15:0> to the chip selection circuit 41 in response to the third selection signal SEL3 at the second level. However, when a semiconductor device including two or four stacked semiconductor chips is used as a semiconductor device having a page size of 1 KB, the second selection circuit 35 transmits the power supply voltage VDD to the chip selection circuit 41 in response to the third selection signal SEL3 at the first level.

The third selection circuit 37 may be implemented by a multiplexer and outputs the power supply voltage VDD or a second part (e.g., RA<15>) of the row address RA<15:0> to the chip selection circuit 41 in response to the fourth selection signal SEL4 output from the fuse box 31. For example, when the semiconductor device 10 illustrated in FIG. 1 is used as a semiconductor device having a page size of 2 KB, the third selection circuit 37 outputs the second part (e.g., RA<15>) of the row address RA<15:0> to the chip selection circuit 41.

When the second selection signal SEL2 is at the first level, the first selection circuit 33 outputs the MSB, BA<2>, of the bank selection address BA<2:0> to the bank address decoder 39 through a first output terminal "0". When the second selection signal SEL2 is at the second level, the first selection circuit 33 outputs the MSB, BA<2>, of the bank selection address BA<2:0> to the chip selection circuit 41 through a second output terminal "1".

The bank address decoder 39 outputs bank enable signals FA through FH (see FIG. 7) for enabling one or two banks among a plurality of banks, e.g., A through H banks, in the memory cell array 50 to the row decoder 70 based on a part (e.g., BA<1:0>) of the bank selection address BA<2:0> output from the address buffer 20, the plurality of first selection signals SEL1, and an output signal (i.e., BA<2>) of the first selection circuit 33 in response to the activated enable signal LatEn output from the chip selection circuit 41. The structure and the operation of the bank address decoder 39 will be described in detail with reference to FIGS. 7 and 8 below.

The chip selection circuit 41 may program a chip identification (ID). For example, the chip ID may be set with two or three bits. When receiving an address (e.g., BA<2>, RA<14>, and RA<15>) the same as the chip ID, the chip selection circuit 41 generates the enable signal LatEn for operating the address buffer 20, the bank address decoder 39, and the data buffer 80.

The fourth selection circuit 43 may be implemented by a multiplexer and outputs the power supply voltage VDD or the second column address CA<11> to the column decoder 60 in response to the fifth selection signal SEL5 output from the fuse box 31. The memory cell array 50 includes a plurality of memory cells, which may be implemented by volatile or non-volatile memory cells. The volatile memory cells may be dynamic random access memory (DRAM) cells. The non-volatile memory cells may be flash memory cells, magnetic RAM (MRAM) cells, ferroelectric RAM (FeRAM) cells, resistive RAM (ReRAM) cells, phase-change RAM (PRAM) cells, etc.

Referring to FIG. 6, a column address (e.g., the first column address CA<9:0>) used when a semiconductor device including one or more stacked semiconductor chips supports a density of 1, 2, or 4 GB is different from a column address (e.g., the first and second column addresses CA<9:0> and CA<11>) used when it supports a density of 8 GB.

The column decoder 60 enables at least one column (e.g., a bitline) in the memory cell array 50 in response to the first column address CA<9:0> or the first and second column addresses CA<9:0> and CA<11>. The row decoder 70 decodes the row address output from the address buffer 20 and the bank enable signals FA through FH output from the bank address decoder 39 and enables at least one row (e.g., wordline) in the memory cell array 50. Accordingly, at least one memory cell is selected in the memory cell array 50 according to a signal output from the column decoder 60 and a signal output from the row decoder 70. Therefore, write data is written to the memory cell array 50 according to a write command and data is read from the memory cell array 50 according to a read command.

The data buffer 80 communicates data DQ<63:0> with an external device and at least one (e.g., 12) of the other semiconductor chips 12 through 18 through a data bus in response to the enable signal LatEn output from the chip selection circuit 41 and a data mask input signal DM<7:0>.

FIG. 6 shows an example of address allocation in the semiconductor chip 11 illustrated in FIG. 5. FIG. 6 shows examples of a width of an input/output data bus (i.e., IO width), a bank selection address (i.e., Bank Adr/Stack), a row address (i.e., Row Adr/Stack), a column address (i.e., Column Adr/stack), a chip selection address (i.e., chip ID), and a page size when each of the semiconductor chips 11 through 18 illustrated in FIG. 1 has a density of 1 GB when a semiconductor device includes one semiconductor chip, when a semiconductor device includes two stacked semiconductor chips, when a semiconductor device includes four stacked semiconductor chips, and when a semiconductor device includes eight stacked semiconductor chips.

Figure 7:
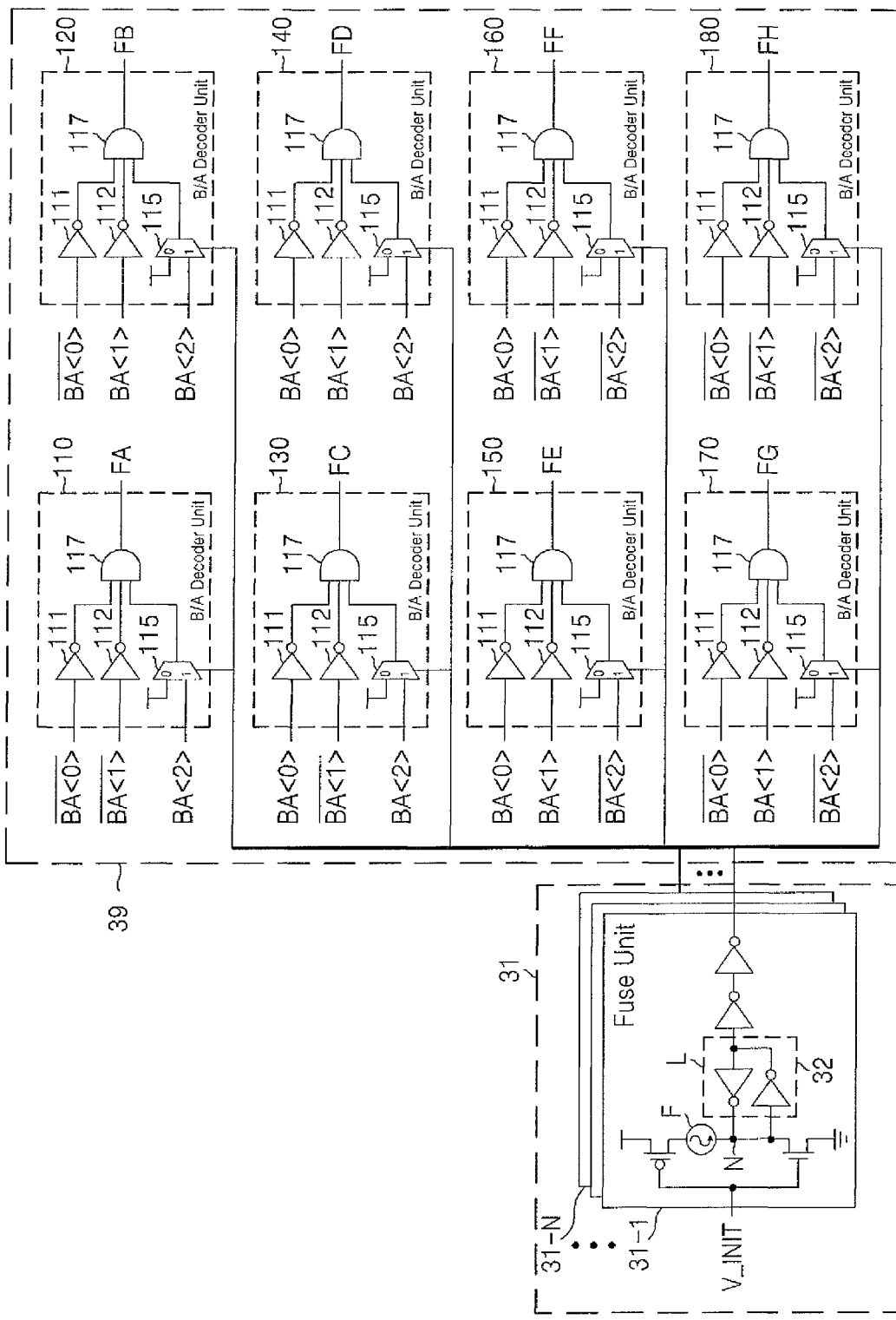
FIG. 7 is a circuit diagram of a programmable page size controller including a selection signal generation circuit and a bank address decoder illustrated in FIG. 5 according to an exemplary embodiment of the inventive concept.

FIG. 7 is a circuit diagram of a programmable page size controller including the selection signal generation circuit 31 and the bank address decoder 39 illustrated in FIG. 5. FIG. 8 shows fuse states of the selection signal generation circuit 31 for controlling the operation of each bank illustrated in FIG. 3. Referring to FIGS. 7 and 8, the selection signal generation circuit 31 includes a plurality of fuse units 31-1 through 31-N (N is a positive integer) and the bank address decoder 39 includes a plurality of bank address decoder units 110 through 180. Each of the address decoder units may include a pair of inverters 111, a selection circuit 115, and an AND gate 117. The inverters 111 receive a part (e.g., BA<1:0>) of the bank selection address BA<2:0> and the selection circuit 115 receives the remaining part (e.g., BA<2>).

The plurality of fuse units 31-1 through 31-N may have the same structure. Referring to FIG. 7, an input signal V_INIT of each a fuse unit 31-1 is at a second level (e.g., a high level) for a predetermined period of time and then transitions to a first level (e.g., a low level). When the input signal V_INIT is at the high level, a voltage at a node N is at a low level due to an N-type metal-oxide semiconductor field effect transistor (NMOSFET). The low level is maintained by a latch L. When a fuse F is cut and the input signal V_INIT transitions from the high level to the low level, the voltage at the node N is maintained at the low level by the latch. As a result, the fuse unit 31-1 outputs a selection signal at a high level. However, when the fuse F is not cut and the input signal V_INIT transitions from the high level to the low level, the voltage at the node N transitions to a high level and is then maintained at the high level by the latch. As a result, the fuse unit 31-1 outputs a selection signal at a low level. For example, each of the fuse units 31-1 through 31-N outputs a different selection signal according to whether the fuse F is cut or not.

FIG. 8 shows which bank is selected according to the level of each bit of the bank selection address BA<2:0> when the fuse F in each of the fuse units is cut. For example, when each fuse unit generates an output signal at a high level a selection circuit 115 included in each of the bank address decoder units 110 through 180 bypasses the MSB, BA<2>, of the bank selection address BA<2:0>. For example, when the bank selection address BA<2:0> is "110", only an A bank enable signal FA for enabling the A bank is output at a high level and bank enable signals FB through FH for respectively enabling the other B through H banks are output at a low level. When the bank selection address BA<2:0> is "111", only the H bank enable signal FH for enabling the H bank is output at a high level and the bank enable signals FA through FG for respectively enabling the other A through G banks are output at a low level.

FIG. 8 shows which two banks are selected according to the level of each bit of a part (e.g., BA<1:0>) of the bank selection address BA<2:0> when the fuse F in each of the fuse units is not cut. When each fuse unit generates the output signal at a low level, the selection circuit 115 included in each of the bank address decoder units 110 through 180 outputs the power supply voltage VDD input through a first input terminal "0", i.e., a signal at a high level. For example, when the part (e.g., BA<1:0>) of the bank selection address BA<2:0> is "11", the band enable signals FA and FH for respectively enabling the A and H banks are output at the high level and the other bank enable signals FB through FG for enabling the other B through G banks are output at the low level. When the part (e.g., BA<1:0>) of the bank selection address BA<2:0> is "01", only the band enable signals FB and FG for enabling the B and G banks are output at the high level.

Figure 9:
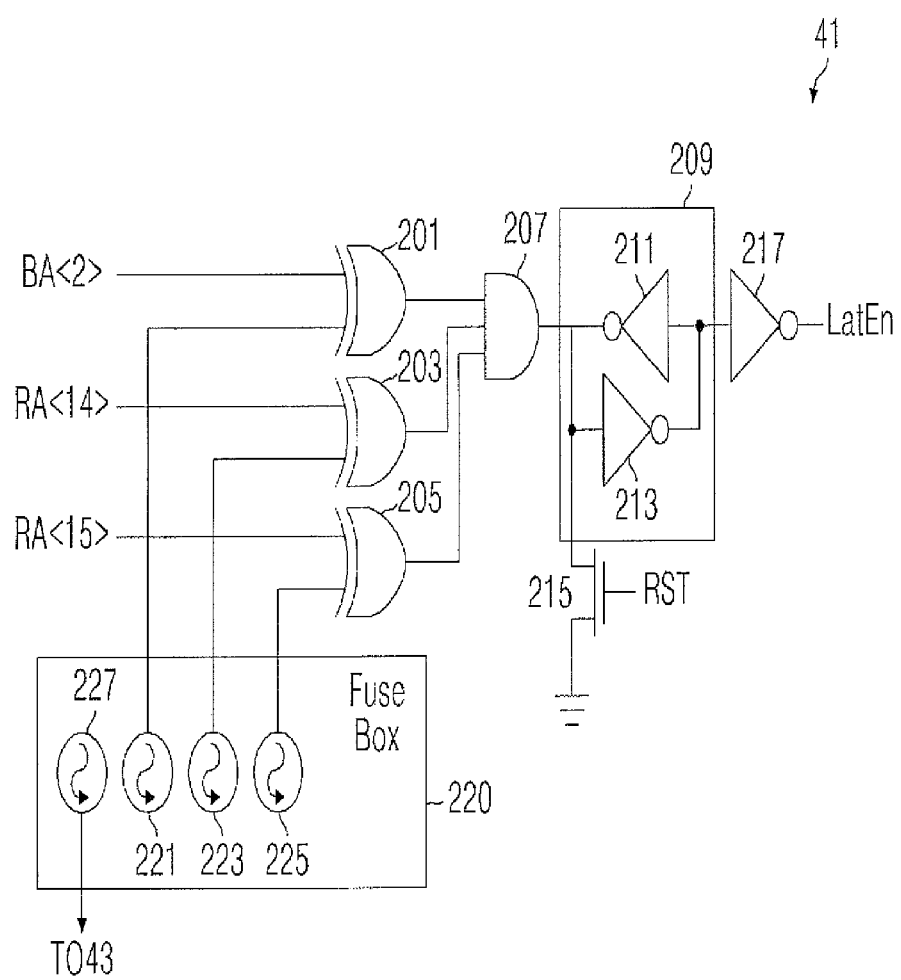
FIG. 9 is a circuit diagram of a chip selection circuit illustrated in FIG. 5 according to an exemplary embodiment of inventive concept.

FIG. 9 is a circuit diagram of the chip selection circuit 41 illustrated in FIG. 5 according to an exemplary embodiment of the inventive concept. The chip selection circuit 41 generates the enable signal LatEn for activating a semiconductor chip according to a part, BA<2>, of the bank selection address BA<2:0> and the first and second parts (e.g., RA<14> and RA<15>) of the row address RA<15:0>. The chip selection circuit 41 includes a plurality of XOR gates 201, 203, and 205, an AND gate 207, a latch circuit 209, a reset circuit 215, an inverter 217, and a fuse box 220 including fuse circuits 221, 223, and 225.

The first XOR gate 201 performs an XOR operation on the part, BA<2>, of the bank selection address BA<2:0> and an output signal of the fuse circuit 221. The second XOR gate 203 performs an XOR operation on the first part, RA<14>, of the row address RA<15:0> and an output signal of the fuse circuit 223. The third XOR gate 205 performs an XOR operation on the second part, RA<15>, of the row address RA<15:0> and an output signal of the fuse circuit 225.

The AND gate 207 performs an AND operation on output signals of the respective XOR gates 201, 203, and 205. The latch circuit 209 includes two inverters 211 and 213 and latches an output signal of the AND gate 207. The reset circuit 215 initializes the output signal of the AND gate 207 in response to a reset signal RST. For example, the reset circuit 215 initializes the output signal of the AND gate 207 to a ground level (e.g., a low level) in response to the reset signal RST. The inverter 217 inverts an output signal of the latch circuit 209 to generate the enable signal LatEn.

The fuse box 220 implemented in each of the semiconductor chips 11 through 18 illustrated in FIG. 1 programs a chip ID for the current semiconductor chip. For ease of discussion, a chip selection address including BA<2>, RA<14>, and RA<15> is assumed to be configured to be ordered sequentially including the part, BA<2>, of the bank selection address BA<2:0>, the first part; RA<14>, of the row address RA<15:0>, and the second part, RA<15>, of the row address RA<15:0>.

For example, when the chip ID of the first semiconductor chip 11 is "000", fuses of the respective fuse circuits 221, 223, and 225 in the fuse box 220 included in the first semiconductor chip 11 are all cut, and the chip selection address BA<2> RA<14> RA<15> input to the chip selection circuit 41 in each of the semiconductor chips 11 through 18 is "000". Thus, the chip selection circuit 41 in the first semiconductor chip 11 only generates the enable signal LatEn at a high level, so that only the first semiconductor chip 11 is activated.

When the chip ID of the second semiconductor chip 12 is "001", fuses of the respective fuse circuits 221 and 223 are cut and a fuse of the fuse circuit 225 is not cut in the fuse box 220 included in the second semiconductor chip 12, and the chip selection address BA<2> RA<14> RA<15> input to the chip selection circuit 41 in each of the semiconductor chips 11 through 18 is "001". Thus, the chip selection circuit 41 in the second semiconductor chip 12 only generates the enable signal LatEn at the high level, so that only the second semiconductor chip 12 is activated.

When the chip ID of the eighth semiconductor chip 18 is "111", fuses of the respective fuse circuits 221, 223, and 225 in the fuse box 220 included in the eighth semiconductor chip 18 are not cut, and the chip selection address BA<2> RA<14> RA<15> input to the chip selection circuit 41 in each of the semiconductor chips 11 through 18 is "111". Thus, the chip selection circuit 41 in the eighth semiconductor chip 18 only generates the enable signal LatEn at the high level, so that only the eighth semiconductor chip 18 is activated.

Table 1 shows chip IDs of the semiconductor chips 11 through 18, chip selection addresses BA<2> RA<14> RA<15>, and the states of fuses of the fuse circuits 221, 223, and 225. The chip selection circuit 41 in each of the semiconductor chips 11 through 18 generates the enable signal LatEn at a first level or a second level according to the chip selection address BA<2>RA<14>RA<15>.

TABLE 1

| | Semiconductor chip | | | | | | |
|---|---|---|---|---|---|---|---|
| | Chip ID | BA<2> | RA<14> | RA<15> | Fuse (221) | Fuse (223) | Fuse (225) |
| First | 000 | 0 | 0 | 0 | Cut | Cut | Cut |
| Second | 001 | 0 | 0 | 1 | Cut | Cut | Uncut |

TABLE 1-continued

Semiconductor chip

| Chip ID | BA<2> | RA<14> | RA<15> | Fuse (221) | Fuse (223) | Fuse (225) |
|---|---|---|---|---|---|---|
| Third | 010 | 0 | 1 | 0 | Cut | Uncut | Cut |
| Fourth | 011 | 0 | 1 | 1 | Cut | Uncut | Uncut |
| Fifth | 100 | 1 | 0 | 0 | Uncut | Cut | Cut |
| Sixth | 101 | 1 | 0 | 1 | Uncut | Cut | Uncut |
| Seventh | 110 | 1 | 1 | 0 | Uncut | Uncut | Cut |
| Eighth | 111 | 1 | 1 | 1 | Uncut | Uncut | Uncut |

FIG. 10 shows fuse states of the fuse box 31 illustrated in FIGS. 5 and 7. Referring to FIGS. 5, 7, and 10, a semiconductor device having a desired density can be implemented by stacking the desired number of semiconductor chips having a particular density (e.g., 1 GB) according to the cut or uncut state of the fuse F of each fuse unit 31-1 included in the selection signal generation circuit 31.

For example, when a semiconductor device having a density of 4 GB is implemented by stacking four semiconductor chips having a density of 1 GB, fuses F for respectively controlling the first and fourth selection circuits 33 and 43 are not cut in the selection signal generation circuit 31 (i.e., the fuse box 31), but fuses F for respectively controlling the second and third selection circuits 35 and 37 are cut in the fuse box 31. Consequently, the selection signals SEL2 and SEL5 are at the first level and the selection signals SEL3 and SEL4 are at the second level. When a semiconductor device having a density of 8 GB is implemented by stacking eight semiconductor chips having a density of 1 GB, fuses F for respectively controlling the first through fourth selection circuits 33, 35, 37, and 43 are cut in the fuse box 31, so that the selection signals SEL2, SEL3, SEL4, and SEL5 are all at the second level.

Figure 11:
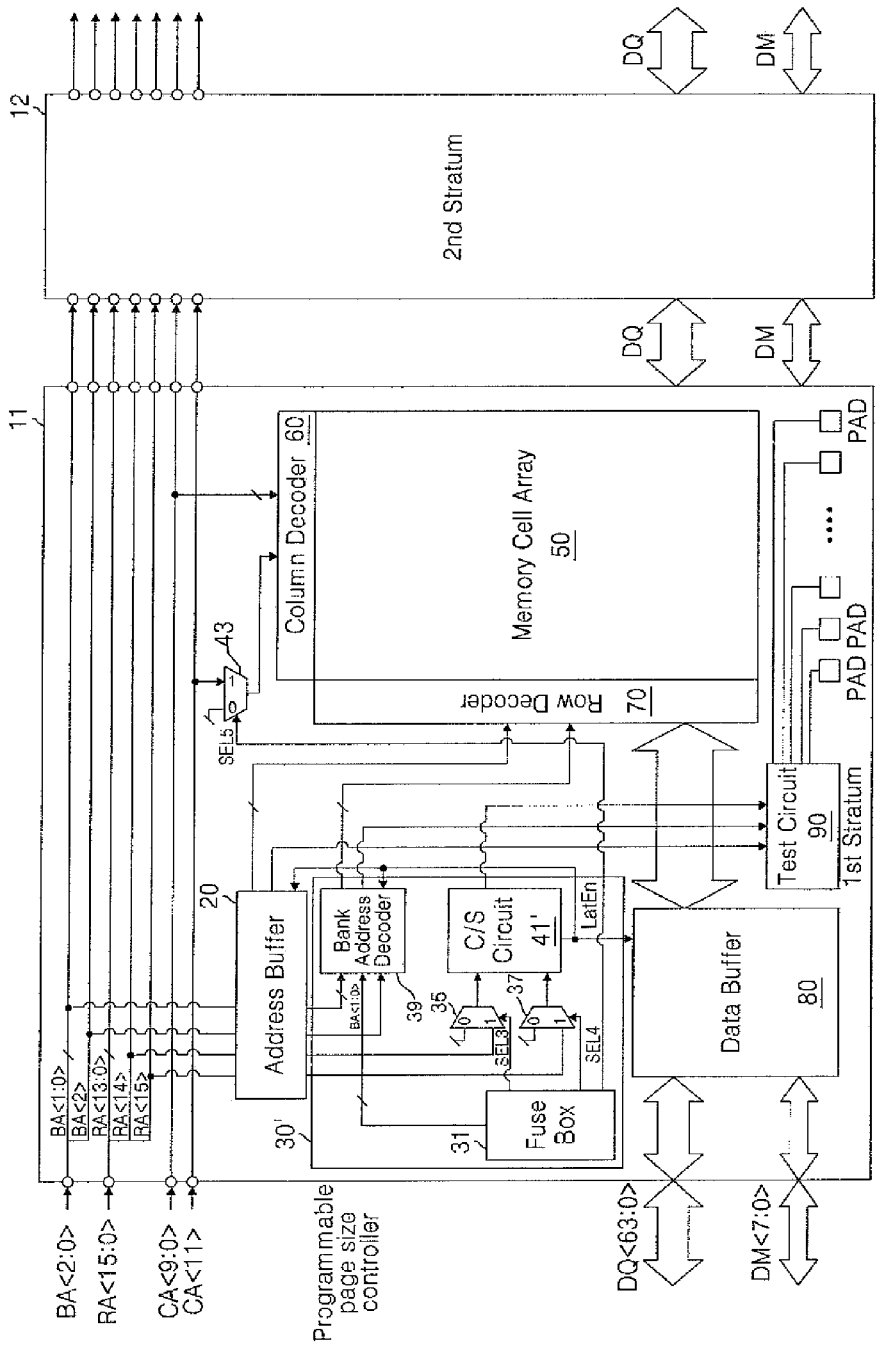
FIG. 11 is a diagram of an internal structure of a semiconductor chip for realizing the scheme illustrated in FIG. 4 according to an exemplary embodiment of the inventive concept.

FIG. 11 is a diagram of an internal structure of a semiconductor chip for realizing the scheme illustrated in FIG. 4 according to an exemplary embodiment of the inventive concept. The internal structure of the semiconductor chip illustrated in FIG. 11 is provided to implement a semiconductor device having a desired density by stacking a plurality of semiconductor chips according to the scheme illustrated in FIG. 4. The semiconductor chip 11 illustrated in FIG. 11 has the same structure as that illustrated in FIG. 5, with the exception of a programmable page size controller 30'.

The programmable page size controller 30' includes the selection signal generation circuit 31, a plurality of the selection circuits 35 and 37, the bank address decoder 39, and a chip selection circuit 41'.

The second selection circuit 35 may be implemented by a multiplexer and outputs the power supply voltage VDD or the first part, RA<14>, of the row address RA<15:0> to the chip selection circuit 41' in response to the third selection signal SEL3. The third selection circuit 37 may be implemented by a multiplexer and outputs the power supply voltage VDD or the second part, RA<15>, of the row address RA<15:0> to the chip selection circuit 41' in response to the fourth selection signal SEL4.

The fourth selection circuit 43 may be implemented by a multiplexer and outputs the power supply voltage VDD or the second column address CA<11> to the column decoder 60 in response to the fifth selection signal SEL5. The bank address decoder 39 decodes the bank selection address BA<2:0> output from the address buffer 20 and outputs a signal for activating one of a plurality of banks to the row decoder 70.

The chip selection circuit 41' outputs the enable signal LatEn for controlling the operation of the address buffer 20 and the operation of the bank address decoder 39 in response to signals output from the respective selection circuits 35 and 37. The operation of the chip selection circuit 41' will be described in detail with reference to FIG. 13 below.

FIG. 12 shows an example of address allocation in the semiconductor chip 11 illustrated in FIG. 11. FIG. 12 shows examples of a width of an input/output data bus (i.e., IO width), a bank selection address (i.e., Bank Adr/Stack), a row address (i.e., Row Adr/Stack), a column address (i.e., Column Adr/stack), a chip selection address (i.e., chip ID), and a page size when each of the semiconductor chips 11 through 18 illustrated in FIG. 1 has a density of 1 GB when a semiconductor device includes one semiconductor chip, when a semiconductor device includes two stacked semiconductor chips, when a semiconductor device includes four stacked semiconductor chips, and when a semiconductor device includes eight stacked semiconductor chips.

For example, when the first and second parts, RA<14> and RA<15>, of the row address RA<15:0> are "00", the first and second semiconductor chips 11 and 12 may be selected. When the first and second parts, RA<14> and RA<15>, of the row address RA<15:0> are "01", the third and fourth semiconductor chips 13 and 14 may be selected. When the first and second parts, RA<14> and RA<15>, of the row address RA<15:0> are "10", the fifth and sixth semiconductor chips 15 and 16 may be selected. When the first and second parts, RA<14> and RA<15>, of the row address RA<15:0> are "11", the seventh and eighth semiconductor chips 17 and 18 may be selected.

Each of the A through H banks may be selected in response to the bank selection address BA<2:0>. For example, when the bank selection address BA<2:0> is "000", "001", "010", "011", "100", "101", "110", or "111", the A, B, C, D, E, F, G, or H bank may be respectively selected.

Accordingly, when the parts, RA<14> and RA<15>, of the row address RA<15:0> are "00" and the bank selection address BA<2:0> is "000", the A bank of the first semiconductor chip 11 and the A bank of the second semiconductor chip 12 may be simultaneously selected. As a result, the semiconductor device 10 has a page size of 2 KB. Alternatively, when the parts, RA<14> and RA<15>, of the row address RA<15:0> are "00" and the bank selection address BA<2:0> is "000", the A bank of the first semiconductor chip 11 and the H bank of the second semiconductor chip 12 may be simultaneously selected, so that the semiconductor device 10 has a page size of 2 KB.

Figure 13:
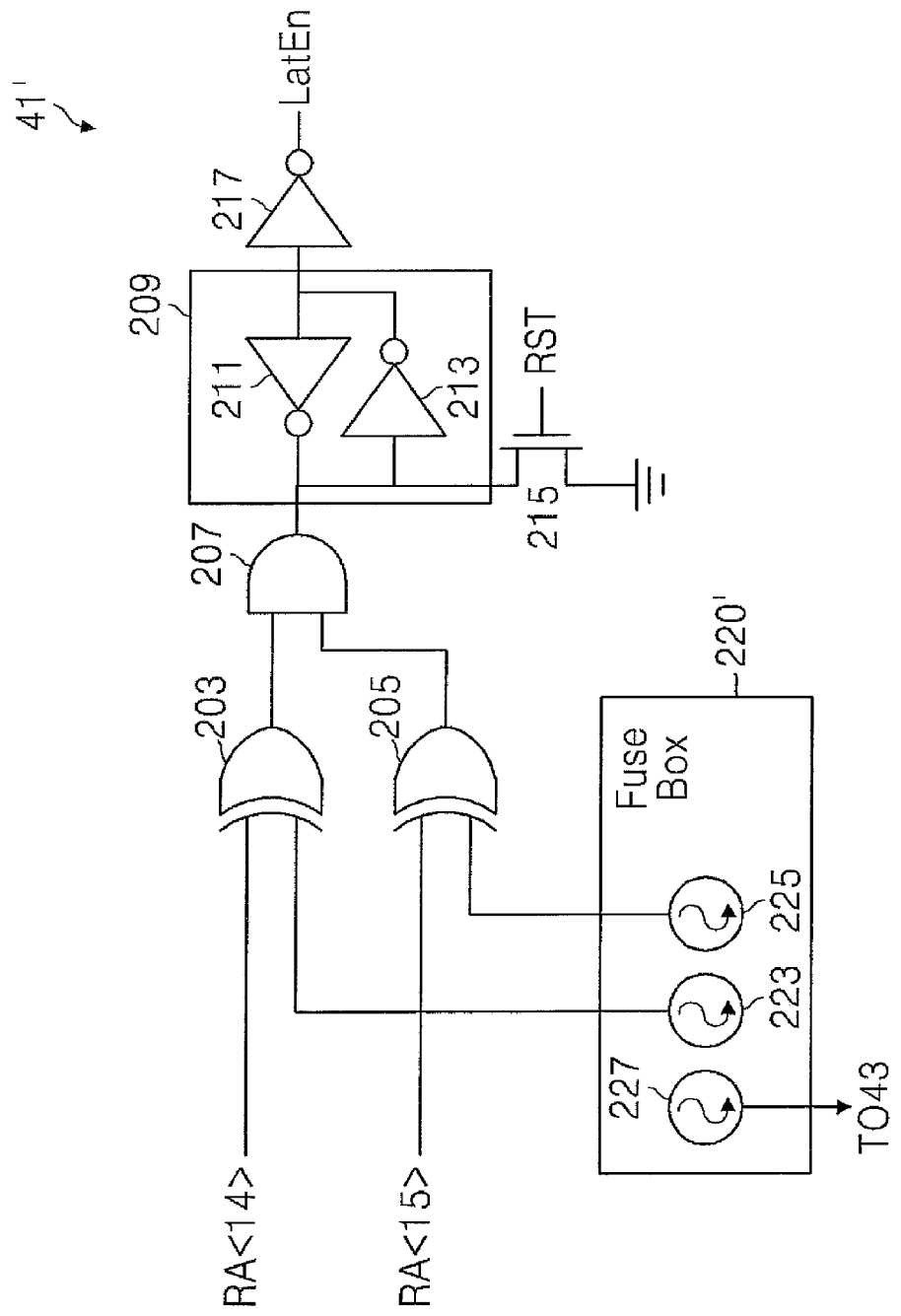
FIG. 13 is a circuit diagram of a chip selection circuit illustrated in FIG. 11 according to an exemplary embodiment of the inventive concept.

FIG. 13 is a circuit diagram of the chip selection circuit 41' illustrated in FIG. 11 according to an exemplary embodiment of the inventive concept. Referring to FIG. 13, the chip selection circuit 41' generates the enable signal LatEn according to the first and second parts, RA<14> and RA<15>, of the row address RA<15:0>. The chip selection circuit 41' generates the activated enable signal LatEn when the chip ID programmed by the chip selection circuit 41' is the same as the first and second parts, RA<14> and RA<15>, of the row address RA<15:0>. The chip selection circuit 41' includes a plurality of the XOR gates 203 and 205, the AND gate 207, the latch circuit 209, the reset circuit 215, the inverter 217, and a fuse box 220' including the fuse circuits 223 and 225.

The XOR gate 203 performs an XOR operation on the first parts, RA<14>, of the row address RA<15:0> and an output signal of the fuse circuit 223. The XOR gate 205 performs an XOR operation on the second parts, RA<15>, of the row address RA<15:0> and an output signal of the fuse circuit 225.

The AND gate 207 performs an AND operation on output signals of the respective XOR gates 203 and 205. The latch circuit 209 includes the two inverters 211 and 213 and latches an output signal of the AND gate 207. The reset circuit 215 initializes the output signal of the AND gate 207 in response to the reset signal RST. The reset circuit 215 may initialize the output signal of the AND gate 207 to a ground level (e.g., a low level) in response to the reset signal RST. The inverter 217 inverts an output signal of the latch circuit 209 to generate the enable signal LatEn.

The fuse box 220' implemented in each of the semiconductor chips 11 through 18 illustrated in FIG. 1 programs a chip ID for the current semiconductor chip. For ease of discussion, a chip selection address is assumed to be configured in order of the first part, RA<14>, of the row address RA<15:0> and the second part, RA<15>, of the row address RA<15:0>.

For example, when the chip ID of the first and second semiconductor chips 11 and 12 is "00", fuses of the respective fuse circuits 223 and 225 in the fuse box 220' included in each of the first and second semiconductor chips 11 and 12 are all cut, and the chip selection address RA<14>RA<15> input to the chip selection circuit 41' in each of the semiconductor chips 11 through 18 is "00". Thus, the chip selection circuit 41' in each of the first and second semiconductor chips 11 and 12 only generates the enable signal LatEn at the high level, so that only the first and second semiconductor chips 11 and 12 are activated.

When the chip ID of the seventh and eighth semiconductor chips 17 and 18 is "11", fuses of the respective fuse circuits 223 and 225 in the fuse box 220' included in each of the seventh and eighth semiconductor chips 17 and 18 are not cut, and the chip selection address RA<14>RA<15> input to the chip selection circuit 41' in each of the semiconductor chips 11 through 18 is "11". Thus, the chip selection circuit 41' in each of the seventh and eighth semiconductor chips 17 and 18 only generates the enable signal LatEn at the high level, so that only the seventh and eighth semiconductor chips 17 and 18 are activated.

Table 2 shows chip IDs of the semiconductor chips 11 through 18, chip selection addresses RA<14>RA<15>, and the states of fuses of the fuse circuits 223 and 225. The chip selection circuit 41' in each of the semiconductor chips 11 through 18 generates the enable signal LatEn at the first level or the second level according to the chip selection address RA<14>RA<15>.

TABLE 2

| Semiconductor chip | | | | |
|---|---|---|---|---|
| Chip ID | RA<14> | RA<15> | Fuse (223) | Fuse (225) |
| First | 00 | 0 | 0 | Cut | Cut |
| Second | 00 | 0 | 1 | Cut | Uncut |
| Third | 01 | 1 | 0 | Uncut | Cut |
| Fourth | 01 | 1 | 1 | Uncut | Uncut |
| Fifth | 10 | 0 | 0 | Cut | Cut |
| Sixth | 10 | 0 | 1 | Cut | Uncut |
| Seventh | 11 | 1 | 0 | Uncut | Cut |
| Eighth | 11 | 1 | 1 | Uncut | Uncut |

FIG. 14 shows fuse states of the fuse box 31 illustrated in FIG. 11. Referring to FIGS. 11 and 14, a semiconductor device having a desired density can be implemented by stacking a desired number of semiconductor chips having a particular density (e.g., 1 GB) according to the cut or uncut state of a fuse of each fuse unit included in the selection signal generation circuit 31.

For example, when a semiconductor device having a density of 4 GB is implemented by stacking four semiconductor chips having a density of 1 GB, fuses for respectively controlling the selection circuits 35 and 37 are cut in the selection signal generation circuit 31 (i.e., the fuse box 31), but a fuse for controlling the selection circuit 43 is not cut in the fuse box 31. When a semiconductor device having a density of 8 GB is implemented by stacking eight semiconductor chips having a density of 1 GB, fuses for respectively controlling the selection circuits 35, 37, and 43 are cut in the fuse box 31, so that the selection signals SEL3, SEL4, and SEL5 are all at the second level.

Figure 15:
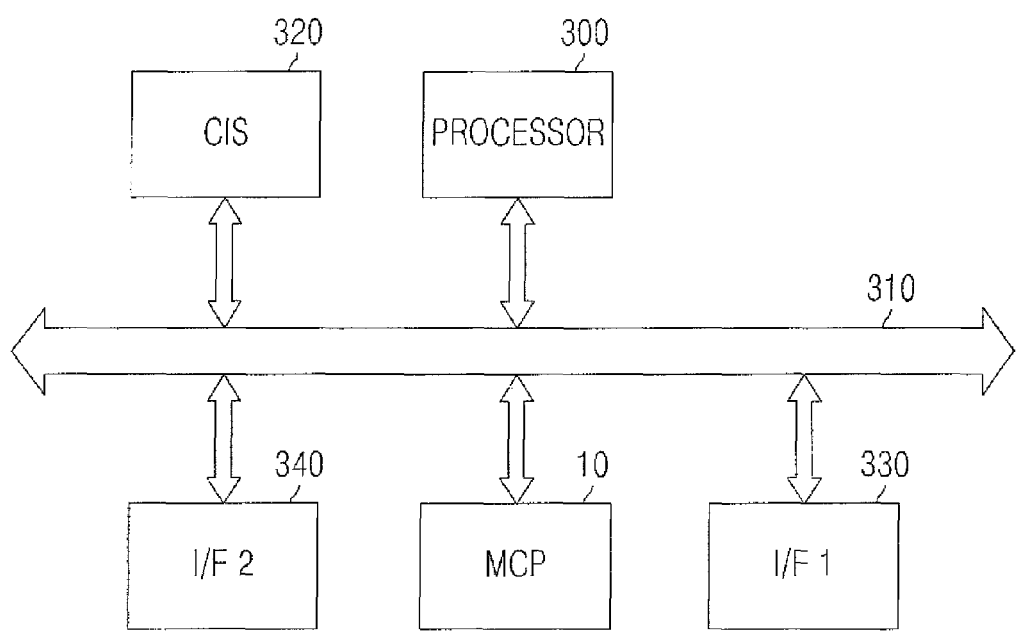
FIG. 15 is a block diagram of a semiconductor system including the semiconductor device illustrated in FIG. 1 according to an exemplary embodiment of the inventive concept.

FIG. 15 is a block diagram of a semiconductor system including the semiconductor device 10 illustrated in FIG. 1 according to an exemplary embodiment of the inventive concept. Referring to FIG. 15, the semiconductor system may be a computer, a notebook computer, a mobile communication device, an image pickup device, an automotive navigation system, etc. The semiconductor system includes the semiconductor device 10 and a processor 300. The processor 300 controls a write operation for writing data to the semiconductor device 10 and a read operation for reading data from the semiconductor device 10.

The semiconductor system may also include a first interface 330 to an external device. For example, the processor 300 may be configured to control data received from the external device through the first interface 330 to be written to the semiconductor device 10 and control data requested by the external device to be read from the semiconductor device 10 and transmitted to the external device.

The semiconductor device 10 may also include an image sensor 320. The image sensor 320 converts an optical image into an electrical signal (i.e., an image signal). The processor 300 may be configured to control the image signal from the image sensor 320 to be processed and then written to the semiconductor device 10. Further, the semiconductor system may transmit the image signal stored in the semiconductor device 10 to the external device (e.g., a printer) through the first interface 330 functioning as an input/output device. The semiconductor system may also include a second interface 340 such as a wireless interface. The processor 300 may be configured to receive data from and transmit data to an external wireless communication device through the second interface 340 connected to a system bus 310.

FIGS. 5 and 11 show examples of a semiconductor chip according to exemplary embodiments of the inventive concept. Each of the semiconductor chips 11 through 18 shown in FIG. 1 has a page size of 1 KB. When the scheme described with reference to FIG. 3 or 4 is used, a page size of the semiconductor device 10 including the eight stacked semiconductor chips 11 through 18 may be set to 2 KB. The semiconductor device 10 has a page size of 1 KB in a first operation mode and a page size of 2 KB in a second operation mode. However, embodiments of the inventive concept are not limited to any particular page size. For example, the references to 1 KB, 2 KB, 4 KB, and 8 KB pages sizes could be respectively replaced with another set of page sizes, such as 2 KB, 4 KB, 8 KB, and 16 KB.

Addresses and cutting states of fuses that have been described above are provided merely for ease of discussion, and embodiments of the inventive concept are not limited thereto. According to at least one embodiment of the present invention, a semiconductor device can adjust a page size according to the number of stacked semiconductor chips, thereby enabling the device to operate at high speed with low power consumption. Further, a multi-chip package including the semiconductor device may operate at a high speed with low power consumption.

While the inventive concept has been particularly shown and described with reference to exemplary embodiments thereof, it will be understood by those of ordinary skill in the art that various changes in forms and details may be made therein without departing from the spirit and scope of the disclosure.

What is claimed is:

1. A semiconductor device comprising:
a memory cell array including a plurality of banks; and
a page size controller configured to set a page size of the semiconductor device based on one of i) a part of a bank selection address and a power supply voltage, and ii) the part of the bank selection address and a part of a row address, and enable one of the plurality of banks or enable two of the plurality of banks based on a remaining part of the bank selection address.

2. The semiconductor device of claim 1, further comprising a chip selection circuit configured to generate an enable signal for enabling the page size controller when a chip selection address including the part of the bank selection address and the part of the row address is the same as an ID of the semiconductor device.

3. The semiconductor device of claim 1, wherein the page size controller comprises:
a selection signal generation circuit configured to generate a plurality of selection signals;
a plurality of selection circuits each configured to output one of the part of the bank selection address and the power supply voltage in response to one selection signal among the plurality of selection signals; and
a plurality of decoding units each configured to receive and decode the remaining part of the bank selection address and an output signal of one of the plurality of selection circuits and to generate a bank enable signal for enabling one of the plurality of banks.

4. The semiconductor device of claim 1, wherein the page size controller comprises a plurality of bank address decoder units, wherein each bank address decoder unit comprises:
a first inverter configured to receive a first bit of the bank selection address;
a second inverter configured to receive a second bit of the bank selection address, the second bit distinct from the first bit;
a selection circuit configured to receive the power supply voltage and a third bit of the bank selection address and output one of the third bit or the power supply voltage in response to a control signal, the third bit distinct from the first and second bits; and
an AND gate configured to receive an output of the first inverter, the second inverter, and the selection circuit.

5. The semiconductor device of claim 4, wherein the page size controller further comprises a plurality of fuse units to respectively generate the control signal for each of the bank address decoder units.

6. The semiconductor device of claim 5, wherein each fuse unit comprises:
a pair of complementary transistors;
a fuse connected between the transistors; and
a latch, wherein an input of the latch is connected to a terminal of the fuse and a terminal of a first one of the transistors.

7. The semiconductor device of claim 6, wherein the first one of the transistors is an N-type metal-oxide field effect transistor.

8. The semiconductor device of claim 1, wherein the one enabled bank is enabled based on the entire bank selection address and the two enabled banks are enabled based on the remaining part of the bank selection address.

9. The semiconductor device of claim 8, wherein the page size is a first value when based on the part of the bank selection address and the power supply voltage, the page size is a second value when based on the part of the bank selection address and the part of the row address, and the first value is lower than the second value.

10. The semiconductor device of claim 9, wherein the second value is twice the first value.

11. A semiconductor device comprising:
a memory cell array including a plurality of banks; and
a page size controller configured to use a part of a row address as a chip ID to enable one bank among the plurality of banks based on a bank selection address in a first operation mode and to use a combination of a part of the bank selection address and the part of the row address as the chip ID to enable at least two banks among the plurality of banks based on a remaining part of the bank selection address in a second operation mode.

12. The semiconductor device of claim 11, wherein the page size controller comprises:
a demultiplexer configured to output the part of the bank selection address;
a bank address decoder configured to enable the one bank among the plurality of banks based on the part of the bank selection address output from the multiplexer and the remaining part of the bank selection address in the first operation mode and to enable at least two banks among the plurality of banks based on the remaining part of the bank selection address in the second operation mode; and
a chip selection circuit configured to enable the bank address decoder when receiving the part of the row address corresponding to the chip ID in the first operation mode and to enable the bank address decoder when receiving the part of the bank selection address and the part of the row address which corresponds to the chip ID in the second operation mode.

13. The semiconductor device of claim 12, wherein the bank address decoder comprises:
a first inverter configured to receive a first bit of the bank selection address;
a second inverter configured to receive a second bit of the bank selection address, the second bit distinct from the first bit;
a selection circuit configured to receive a power supply voltage and a third bit of the bank selection address and output one of the third bit or the power supply voltage in response to a control signal, the third bit distinct from the first and second bits; and
an AND gate configured to receive an output of the first inverter, the second inverter, and the selection circuit.

14. The semiconductor device of claim 13, wherein the page size controller further comprises a plurality of fuse units to respectively generate the control signal for each of the bank address decoders.

15. The semiconductor device of claim 14, wherein each fuse unit comprises:
a pair of complementary transistors; a fuse connected between the transistors; and
a latch, wherein an input of the latch is connected to a terminal of the fuse and a terminal of a first one of the transistors.

16. The semiconductor device of claim 15, wherein the first one of the transistors is an N-type metal-oxide field effect transistor.

17. A semiconductor device comprising:
a memory cell array including a plurality of banks; and
a page size controller configured to set a page size of the semiconductor device based on a part of a bank selection address and a power supply voltage, and enable one of the plurality of banks or enable two of the plurality of banks based on a remaining part of the bank selection address.

18. The semiconductor device of claim 17, wherein the one enabled bank is enabled based on the entire bank selection address and the two enabled banks are enabled based on the remaining part of the bank selection address.

19. The semiconductor device of claim 17, wherein the page size controller sets the page size to a first value based on i) the part of the bank selection address and the power supply voltage and to a second value based on ii) the part of the bank selection address and a part of a row address, wherein the first value is lower than the second value.

20. The semiconductor device of claim 19, wherein the second value is twice the first value.

* * * * *